United States Patent
Takahashi et al.

(10) Patent No.: US 7,008,519 B2
(45) Date of Patent: Mar. 7, 2006

(54) SPUTTERING TARGET FOR FORMING HIGH-RESISTANCE TRANSPARENT CONDUCTIVE FILM, AND METHOD FOR PRODUCING THE FILM

(75) Inventors: Seiichiro Takahashi, Ageo (JP); Makoto Ikeda, Ageo (JP); Hiroshi Watanabe, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 135 days.

(21) Appl. No.: 10/444,078

(22) Filed: May 23, 2003

(65) Prior Publication Data

US 2004/0231981 A1    Nov. 25, 2004

(51) Int. Cl.
 C23C 14/34    (2006.01)
 C01B 13/14    (2006.01)
 C01G 17/02    (2006.01)
(52) U.S. Cl. ............ 204/192.23; 204/192.22; 204/192.29; 204/192.26; 204/298.13; 423/618; 423/592.1

(58) Field of Classification Search ........... 204/298.13, 204/192.22, 192.23, 192.29, 192.26; 423/618, 423/592.1
See application file for complete search history.

(56) References Cited

U.S. PATENT DOCUMENTS 6,669,830 B1 * 12/2003 Inoue et al. ........... 204/298.13
2003/0218153 A1 * 11/2003 Abe ....................... 252/500

FOREIGN PATENT DOCUMENTS

JP    9-209134 A    8/1997

OTHER PUBLICATIONS

English translation of JP 9-209134.*
English translation of JP 2003-105532.*

* cited by examiner

Primary Examiner—Steven Versteeg
(74) Attorney, Agent, or Firm—Sughrue Mion, PLLC

(57) ABSTRACT

The present invention provides an ITO sputtering target for forming a high-resistance transparent conductive film which target can be used virtually in a DC magnetron sputtering apparatus and can form a high-resistance, transparent film, and a method for producing a high-resistance transparent conductive film. The sputtering target for forming a high-resistance transparent conductive film having a resistivity of about $(0.8–10) \times 10^{-3}$ $\Omega$cm contains indium oxide, an insulating oxide, and optionally tin oxide.

4 Claims, 3 Drawing Sheets

SPUTTERING TARGET FOR FORMING HIGH-RESISTANCE TRANSPARENT CONDUCTIVE FILM, AND METHOD FOR PRODUCING THE FILM

BACKGROUND OF THE INVENTION

1. Field of the Invention

The present invention relates to a sputtering target for use in production of a high-resistance transparent conductive film having a resistivity of about $(0.8-10) \times 10^{-3}$ $\Omega$cm, and to a method for producing a high-resistance transparent conductive film from the sputtering target.

2. Background Art

Indium oxide-tin oxide ($In_2O_3$—$SnO_2$ complex oxide, hereinafter referred to as "ITO") film, which is a transparent conductive film having high visible light transparency and high electrical conductivity, finds a variety of uses including heat-generating film for preventing dew formation on liquid crystal displays or glass plates, and infrared beam-reflecting film.

When transparent conductive film is used in a flat panel display (FPD), a low-resistivity transparent conductive film having a resistivity of about $2 \times 10^{-4}$ $\Omega$cm is employed.

Meanwhile, a transparent conductive film employed as a resistance touch panel attached to displays such as the above FPD is required to exhibit high-resistance characteristics (e.g., sheet resistance of about 700 to 1,000 $\Omega$) on the basis of the operation mechanism of the touch panel.

However, in order for an ITO film conventionally employed in FPDs to be used as a transparent conductive film for a touch panel, the thickness of the conductive film must be reduced considerably, raising a problem that sufficient touch panel strength fails to be ensured.

Also, when the resistance of an ITO sputtering target itself is increased, a DC magnetron sputtering apparatus, which is inexpensive as compared with a high-frequency magnetron sputtering apparatus, cannot be employed. Thus, facility cost increases enormously, raising another problem.

SUMMARY OF THE INVENTION

In view of the foregoing, the present invention has been accomplished in order to solve the aforementioned problem. Thus, an object of the present invention is to provide an ITO sputtering target for forming a high-resistance transparent conductive film which target can be used virtually in a DC magnetron sputtering apparatus and can form a high-resistance, transparent film. Another object of the invention is to provide a method for producing a high-resistance transparent conductive film.

Accordingly, in a first mode of the present invention for solving the aforementioned problems, there is provided a sputtering target for forming a high-resistance transparent conductive ITO film having a resistivity of about (0.8–10) $\times 10^{-3}$ $\Omega$cm, the target comprising indium oxide, an insulating oxide, and optionally tin oxide, According to first mode, addition of the insulating oxide to the ITO sputtering target increases the resistivity of the formed transparent conductive film without greatly modifying the resistivity of the target itself.

In a second mode of the present invention, the insulating oxide mentioned in relation to the first mode is at least one species selected from the group consisting of silicon oxide, aluminum oxide, tantalum oxide, hafnium oxide, niobium oxide, yttrium oxide, cerium oxide, praseodymium oxide, beryllium oxide, magnesium oxide, calcium oxide, strontium oxide, barium oxide, scandium oxide, titanium oxide, zirconium oxide, vanadium oxide, boron oxide, gallium oxide, zinc oxide, chromium oxide, manganese oxide, iron oxide, molybdenum oxide, phosphorus oxide, and lanthanoid oxides.

According to the second mode, addition of an oxide such as silicon oxide, aluminum oxide, tantalum oxide, niobium oxide, yttrium oxide, cerium oxide, or praseodymium oxide to the sputtering target increases the resistivity of the formed transparent conductive film without greatly modifying the resistivity of the target itself.

In a third mode of the present invention, the insulating oxide mentioned in relation to the second mode is silicon oxide.

According to the third mode, addition of silicon oxide to the sputtering target increases the resistivity of the formed transparent conductive film without greatly modifying the resistivity of the target itself.

In a fourth mode of the present invention, the sputtering target mentioned in relation to any one of the first to third modes contains an amount of an element which forms the aforementioned insulating oxide with oxygen, the amount being 0.00001 to 0.26 mol based on 1 mol of indium.

According to the fourth mode, addition of a predetermined amount of insulating oxide to the sputtering target increases the resistivity of the formed transparent conductive film without greatly modifying the resistivity of the target itself.

In a fifth mode of the present invention, the sputtering target mentioned in relation to any one of the first to fourth modes contains tin (Sn) in an amount of 0 to 0.3 mol based on 1 mol of indium.

According to the fifth mode, a sputtering target containing predominantly indium oxide and optionally tin oxide is obtained.

In a sixth mode of the present invention, the sputtering target mentioned in relation to any one of the first to fifth modes is subjected to DC magnetron sputtering, to thereby form a transparent conductive film having a resistivity of $(0.8-10) \times 10^{-3}$ $\Omega$cm.

According to the six mode, a high-resistivity transparent conductive film can be produced through DC magnetron sputtering.

A seventh mode of the present invention provides a method for producing a high-resistance transparent conductive film, comprising forming a transparent conductive film having a resistivity of $(0.8-10) \times 10^{-3}$ $\Omega$cm through DC magnetron sputtering from a sputtering target containing indium oxide, an insulating oxide, and optionally tin oxide.

According to the seventh mode, a sputtering target containing an insulating oxide is used. Thus, a transparent conductive film having a resistivity of $(0.8-10) \times 10^{-3}$ $\Omega$cm can be formed through DC magnetron sputtering without greatly modifying the resistivity of the target itself.

In an eighth mode of the present invention, the insulating oxide mentioned in relation to the seventh mode is at least one species selected from the group consisting of silicon oxide, aluminum oxide, tantalum oxide, hafnium oxide, niobium oxide, yttrium oxide, cerium oxide, praseodymium oxide, beryllium oxide, magnesium oxide, calcium oxide, strontium oxide, barium oxide, scandium oxide, titanium oxide, zirconium oxide, vanadium oxide, boron oxide, gallium oxide, zinc oxide, chromium oxide, manganese oxide, iron oxide, molybdenum oxide, phosphorus oxide, and lanthanoid oxides.

According to the eighth mode, a sputtering target containing an oxide such as silicon oxide, aluminum oxide, tantalum oxide, niobium oxide, yttrium oxide, cerium oxide, or praseodymium oxide is used. Thus, a transparent conductive film having a resistivity of $(0.8–10) \times 10^{-3}$ Ωcm can be formed through DC magnetron sputtering without greatly modifying the resistivity of the target itself.

In a ninth mode of the present invention, the insulating oxide mentioned in relation to the eighth mode is silicon oxide.

According to the ninth mode, a sputtering target containing silicon oxide is used. Thus, a transparent conductive film having a resistivity of $(0.8–10) \times 10^{-3}$ Ωcm can be formed through DC magnetron sputtering without greatly modifying the resistivity of the target itself.

In a tenth mode of the present invention, the sputtering target mentioned in relation to any one of the seventh to ninth modes contains an amount of an element which forms the aforementioned insulating oxide with oxygen, the amount being 0.00001 to 0.26 mol based on 1 mol of indium.

According to the tenth mode, a sputtering target containing a predetermined amount of insulating oxide is used, Thus, a transparent conductive film having a resistivity of $(0.8–10) \times 10^{-3}$ Ωcm can be formed through DC magnetron sputtering without greatly modifying the resistivity of the target itself.

In an eleventh mode of the present invention, the sputtering target mentioned in relation to any one of the seventh to tenth modes contains tin (Sn) in an amount of 0 to 0.3 mol based on 1 mol of indium.

According to the eleventh mode, a sputtering target containing predominantly indium oxide and optionally tin oxide is used. Thus, a transparent conductive film having a resistivity of $(0.8–10) \times 10^{-3}$ Ωcm can be formed through DC magnetron sputtering without greatly modifying the resistivity of the target itself.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with accompanying drawings, in which.

DETAILED DESCRIPTION OF PREFERRED EMBODIMENTS

Figure 1:
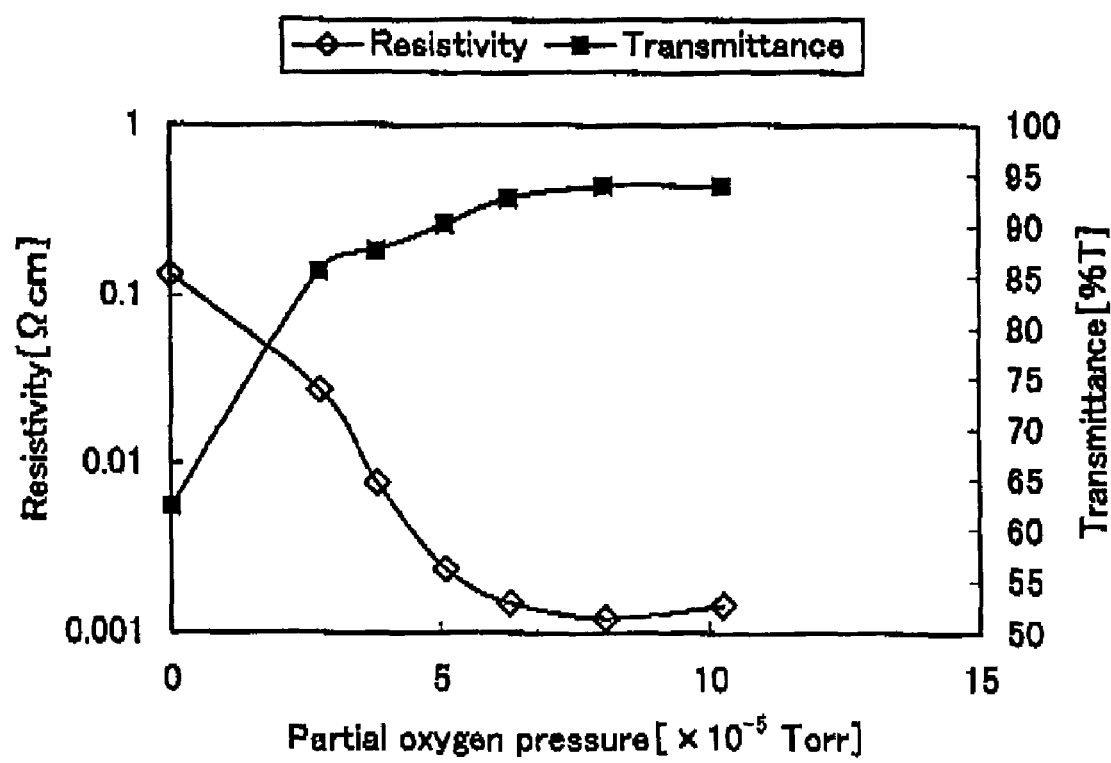
FIG. 1 is a graph showing the relationship between partial oxygen pressure and resistivity and the relationship between partial oxygen pressure and transmittance (at a wavelength of 550 nm) of transparent conductive film produced in Example 1.

The sputtering target for forming a high-resistance transparent-conductive film according to the present invention is a sintered oxide which contains indium oxide as a predominant component, tin oxide as an optional component, and an insulating oxide as an additive. No particular limitation is imposed on the form of the component oxides, and the oxides may assume individual oxides, complex oxides thereof, or solid solution thereof.

Examples of the insulating oxide include silicon oxide, aluminum oxide, tantalum oxide, hafnium oxide, niobium oxide, yttrium oxide, cerium oxide, praseodymium oxide, beryllium oxide, magnesium oxide, calcium oxide, strontium oxide, barium oxide, scandium oxide, titanium oxide, zirconium oxide, vanadium oxide, boron oxide, gallium oxide, zinc oxide, chromium oxide, manganese oxide, iron oxide, molybdenum oxide, phosphorus oxide, and lanthanoid oxides.

The insulating oxide preferably has a standard energy of formation lower than that of indium oxide within a temperature range about 0 to about 1,600° C. This is because such an insulating oxide is chemically more stable than indium oxide and difficult to decompose.

The insulating oxide content (amount of the element(s) which form(s) the aforementioned insulating oxide with oxygen) preferably falls within a range of 0.00001 to 0.26 mol based on 1 mol of indium. This is because when the insulating oxide content is less than the lower limit, the effect of addition is no longer prominent, whereas when the content is in excess of the upper limit, the resistance of the formed transparent conductive film is excessively high.

In the present invention, the tin (Sn) content falls within a range of 0 to 0.3 mol based on 1 mol of indium. When tin is incorporated into the sputtering target, the tin (Sn) content falls within a range of 0.001 to 0.3 mol, preferably 0.01 to 0.15 mol, more preferably 0.05 to 0.1 mol based on 1 mol of indium. When the tin content falls within the above ranges, density and mobility of carriers (electrons) present in the sputtering target can be appropriately controlled, thereby maintaining electrical conductivity within an appropriate range. In contrast, when the tin content falls outside the above ranges, mobility of carriers present in the sputtering target decreases and conductivity deteriorates, which is not preferred.

The sputtering target for forming a high-resistance transparent conductive film of the present invention has such a low resistivity as to permit DC magnetron sputtering of the target. However, from the sputtering target, a high-resistance transparent conductive film having a resistivity of $(0.8–10) \times 10^{-3}$ Ωcm can be formed.

Needless to say, a high-frequency magnetron sputtering apparatus may also be employed, to thereby form a high-resistance transparent conductive film having a resistivity of $(0.8–10) \times 10^{-3}$ Ωcm.

The method for producing the sputtering target of the present invention will next be described with reference to some exemplary steps, which should not be construed as limiting the production method thereto.

Generally employed starting materials for forming the sputtering target of the present invention include $In_2O_3$, $SnO_2$, $SiO_2$ powders. Instead of these oxides, the corresponding elements, compounds, complex oxides, etc. may be employed as starting materials. Prior to use as starting materials, the elements and compounds are subjected to a process for transforming into the corresponding oxides.

No particular limitation is imposed on the methods of mixing the raw material powders in desired proportions and of compacting the mixture. The resultant mixture is compacted through any of conventionally known wet methods and dry methods.

Examples of the dry methods include the cold press method and the hot press method. According to the cold press method, a powder mixture is charged into a mold and pressed so as to form a compact, and the resultant compact is fired and sintered in air or an oxygen-containing atmosphere. According to the hot press method, a powder mixture placed in a mold is sintered with pressing.

Examples of preferred wet methods include a filtration molding method (disclosed in Japanese Patent Application Laid-Open (kokai) No. 11-286002). The filtration molding method employs a filtration mold, formed of a water-insoluble material, for removing water under reduced pressure from a ceramic raw material slurry, to thereby yield a compact, the filtration mold comprising a lower mold having one or more water-discharge holes; a water-passing filter for placement on the lower mold; a seal material for sealing the filter; and a mold frame for securing the filter from the upper side through intervention of the seal material. The lower mold, mold frame, seal material, and filter, which can be separated from one another, are assembled to thereby form the filtration mold. According to the filtration molding method, water is removed under reduced pressure from the slurry only from the filter side. In a specific operation making use of the filtration mold, a ceramic powder mixture, ion-exchange water, and an organic additive are mixed, to thereby prepare a slurry, and the slurry is poured into the filtration mold. Water contained in the slurry is removed under reduced pressure from only the filter side, a compact is yielded. The resultant ceramic compact is dried, debindered, and fired.

In the aforementioned methods, the firing temperature is preferably 1,300 to 1,600° C., more preferably 1,300 to 1,450° C. After firing, the fired compact is mechanically worked so as to form a target having predetermined dimensions,

EXAMPLES

The present invention will next be described in detail by way of examples, which should not be construed as limiting the invention thereto.

Example 1

$In_2O_3$ powder (purity: >99.99%), $SnO_2$ powder (purity: >99.99%), and $SiO_2$ powder (purity: >99.9%) were mixed in proportions of 85 wt. %, 10 wt. %, and 5 wt. % (Si: about 0.13 mol based on 1 mol of In), respectively, to thereby yield a powder mixture (approximately 1.5 kg). The mixture was compacted through filtration molding, to thereby prepare a compact. The compact was fired in an oxygen-containing atmosphere at 1,550° C. for 8 hours, to thereby yield a sintered compact. The sintered compact was subjected to a working step, to thereby yield a target having a relative density of 100% based on the theoretical density. The target was found to have a bulk resistivity of $2.4 \times 10^{-4}$ Ωcm.

The target was subjected to DC magnetron sputtering under the following conditions, whereby an oxide film having a thickness of 1,200 Å was formed.

Sputtering Conditions:
  Target dimensions: φ=6 inches, t=6 mm
  Mode of sputtering: DC magnetron sputtering
  Evacuation apparatus: Rotary pump+cryo-pump
  Vacuum attained: $4.0 \times 10^{-6}$ [Torr]
  Ar pressure: $3.0 \times 10^{-3}$ [Torr]
  Oxygen pressure: $1 \times 10^{-5}$ to $10 \times 10^{-5}$ [Torr]
  Substrate temperature: 200° C.
  Electric power for sputtering: 300 W (power density: 1.6 W/cm$^2$)
  Substrate used: TEMPAX (glass sheet for liquid crystal display, t 1.8 mm)

Through analysis of the film in terms of resistivity and transmittance, the relationship between partial oxygen pressure and resistivity and the relationship between partial oxygen pressure and transmittance (at a wavelength of 550 nm) were obtained. The results are shown in FIG. 1.

Comparative Example 1

$In_2O_3$ powder (purity: >99.99%) and $SnO_2$ powder (purity: >99.99%) were mixed in proportions of 90 wt. % and 10 wt. %, respectively, to thereby yield a powder mixture (approximately 1.5 kg). The mixture was compacted through filtration molding, to thereby prepare a compact. The compact was fired in an oxygen-containing atmosphere at 1,550° C. for 8 hours, to thereby yield a sintered compact. The sintered compact was subjected to a working step, to thereby yield a target having a relative density of 99.6% based on the theoretical density. The target was found to have a bulk resistivity of $1.7 \times 10^{-4}$ Ωcm.

Figure 2:
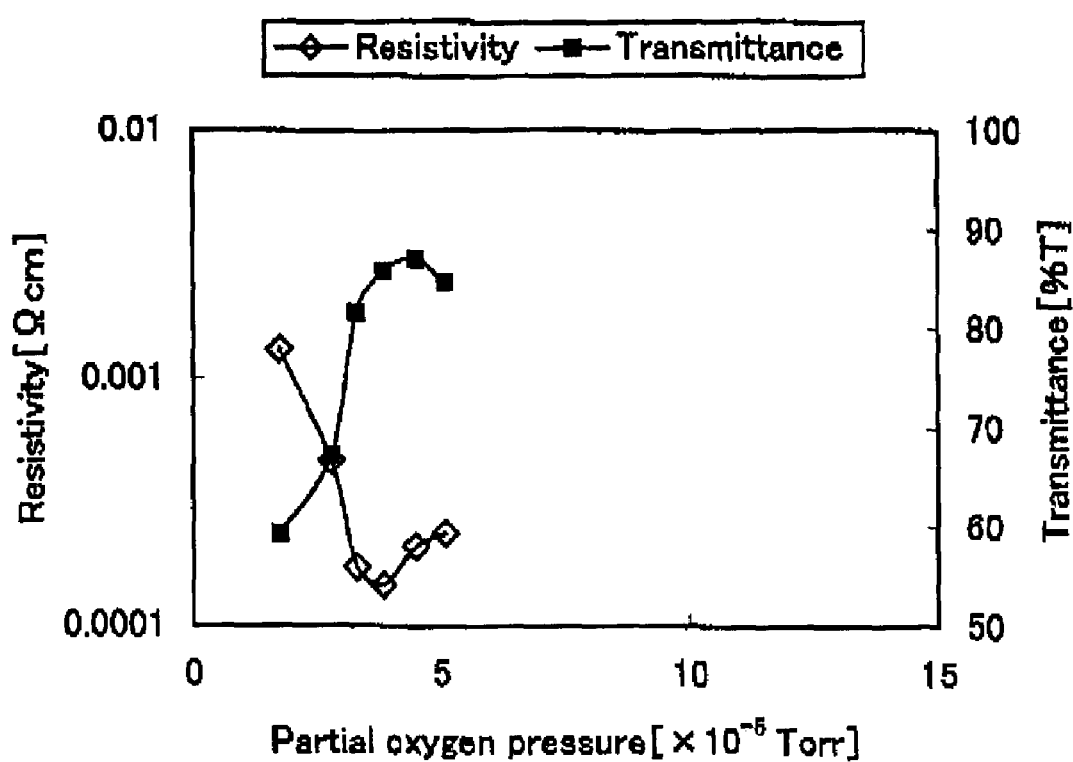
FIG. 2 is a graph showing the relationship between partial oxygen pressure and resistivity and the relationship between partial oxygen pressure and transmittance (at a wavelength of 550 nm) of transparent conductive film produced in Comparative Example 1.

The target was subjected to DC magnetron sputtering under the conditions as employed in Example 1, whereby an oxide film having a thickness of 2,000 Å was formed. Through analysis of the film in terms of resistivity and transmittance, the relationship between partial oxygen pressure and resistivity and the relationship between partial oxygen pressure and transmittance (at a wavelength of 550 nm) were obtained. The results are shown in FIG. 2.

Example 2

$In_2O_3$ powder (purity: >99.99%), $SnO_2$ powder (purity: >99.99%), and $SiO_2$ powder (purity: >99.9%) were mixed in proportions of 80 wt. %, 10 wt. %, and 10 wt. % (Si: about 0.26 mol based on 1 mol of In), respectively, to thereby yield a powder mixture (approximately 1.5 kg). The mixture was compacted through filtration molding, to thereby prepare a compact. The compact was fired in an oxygen-containing atmosphere at 1,550° C. for 8 hours, to thereby yield a sintered compact. The sintered compact was subjected to a working step, to thereby yield a target having a relative density of 100% based on the theoretical density. The target was found to have a bulk resistivity of $4.0 \times 10^{-4}$ Ωcm.

Figure 3:
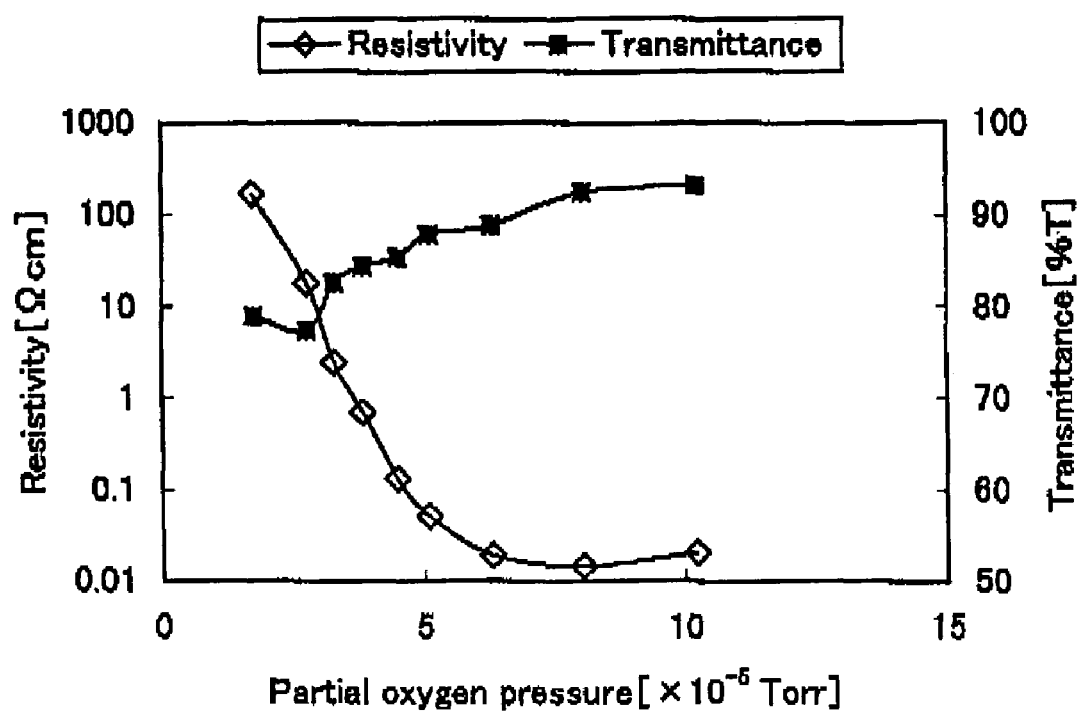
FIG. 3 is a graph showing the relationship between partial oxygen pressure and resistivity and the relationship between partial oxygen pressure transmittance (at a wavelength of 550 nm) of transparent conductive film produced in Example 2.

The target was subjected to DC magnetron sputtering under the conditions as employed in Example 1, whereby an oxide film having a thickness of 1,200 Å was formed. Through analysis of the film in terms of resistivity and transmittance, the relationship between partial oxygen pressure and resistivity and the relationship between partial oxygen pressure and transmittance (at a wavelength of 550 nm) were obtained. The results are shown in FIG. 3.

Example 3

$In_2O_3$ powder (purity: >99.99%), $SnO_2$ powder (purity: >99.99%), and $SiO_2$ powder (purity: >99.9%) were mixed in proportions of 85 wt. %, 10 wt. %, and 5 wt. % (Si: about 0.13 mol based on 1 mol of In), respectively, to thereby yield a powder mixture (approximately 1.5 kg). The mixture was compacted through filtration molding, to thereby prepare a compact. The compact was fired in an oxygen-containing atmosphere at 1,450° C. for 8 hours, to thereby yield a sintered compact. The sintered compact was subjected to a working step, to thereby yield a target having a relative density of 100% based on the theoretical density. The target was found to have a bulk resistivity of $3.0×10^{-4}$ Ωcm.

The target was subjected to DC magnetron sputtering under the conditions as employed in Example 1, whereby an oxide film having a thickness of 1,200 Å was formed. Through analysis of the film, variation profiles of resistivity and transmittance with respect to partial oxygen pressure were found to be similar to those shown in FIG. 1.

As described above, the sputtering targets produced in Examples 1 to 3 had a bulk resistivity on the level of some $10^{-4}$ Ωcm, which is almost equivalent to the bulk resistivity of the conventional ITO target of Comparative Example 1. Such a low bulk resistivity indicates that the sputtering targets of the invention can be subjected to DC magnetron sputtering.

The film samples produced in Examples 1 to 3 exhibit variation profiles of resistivity and transmittance with respect to partial oxygen pressure similar to those of the conventional ITO film produced in Comparative Example 1. The similarity indicates that conventional methods for forming ITO film can also be employed for forming transparent conductive film from the sputtering target of the present invention.

A resistivity at an optimum partial oxygen pressure of the transparent conductive film of Example 1 is ten times that of the conventional ITO film produced in Comparative Example 1. Similarly, a resistivity at an optimum partial oxygen pressure of the transparent conductive film of Example 2 is one hundred times that of the ITO film of Comparative Example 1.

If a commercial transparent conductive film having a thickness of about 150 Å is produced from the sputtering target of the present invention, sheet resistance of the film produced in accordance with Example 1 would be about 700 Ω, and that of the film produced in accordance with Example 2 would be about 7,000 Ω. If a commercial transparent conductive film having a thickness of 1,500 Å is produced, sheet resistance of the film produced in accordance with Example 1 would be about 70 Ω, and that of the film produced in accordance with Example 2 would be about 700 Ω.

As is already known, when the amount of $SnO_2$ added to the sputtering target increases, carrier formation is promoted, thereby lowering the resistance thereof. Thus, in addition to controlling the amount of $SiO_2$, modification of the amount of $SnO_2$ can control the resistivity of the sputtering target.

Therefore, optimum resistivity of transparent conductive film can be attained by controlling the amounts of $SnO_2$ and $SiO_2$.

As described hereinabove, the present invention provides a sputtering target for forming a high-resistance transparent conductive film having a resistivity of about $(0.8–10)×10^{-3}$ Ωcm, comprising indium oxide, an insulating oxide, and optionally tin oxide. From the sputtering target, a high-resistance transparent conductive film can be formed virtually by means of a DC magnetron sputtering apparatus.

What is claimed is:

1. A sputtering target for forming a high-resistance transparent conductive ITO film having a resistivity of about $(0.8–10)×10^{-3}$ Ωcm, the target comprising indium oxide, an insulating oxide comprising silicon oxide, and optionally tin oxide, wherein a transparent conductive film formed by subjecting the sputtering target to DC magnetron sputtering has a resistivity of $(0.8–10)×10^{-3}$ Ωcm, and wherein the sputtering target contains an amount of an element which forms the insulating oxide with oxygen, the amount being 0.00001 to 0.26 mol based on 1 mol of indium.

2. A sputtering target for forming a high-resistance transparent conductive film according to claim 1, wherein the sputtering target contains tin (Sn) in an amount of 0 to 0.3 mol based on 1 mol of indium.

3. A method for producing a high-resistance transparent conductive film, comprising forming a transparent conductive film having a resistivity of $(0.8–10)×10^{-3}$ Ωcm through DC magnetron sputtering from a sputtering target containing indium oxide, an insulating oxide comprising silicon oxide, and optionally tin oxide, wherein the sputtering target contains an amount of an element which forms the insulating oxide with oxygen, the amount being 0.00001 to 0.26 mol based on 1 mol of indium.

4. A method for producing a high-resistance transparent conductive film according to claim 3, wherein the sputtering target contains tin (Sn) in an amount of 0 to 0.3 mol based on 1 mol of indium.

* * * * *